(12) United States Patent
Kim et al.

(10) Patent No.: US 10,283,571 B2
(45) Date of Patent: May 7, 2019

(54) ORGANIC LIGHT EMITTING DISPLAY DEVICE WITH BANK STRUCTURE FOR ENHANCED IMAGE QUALITY AND HEAD MOUNTED DISPLAY INCLUDING THE SAME

(71) Applicant: LG Display Co., Ltd., Seoul (KR)

(72) Inventors: JongSung Kim, Paju-si (KR); JongGeun Yoon, Gunpo-si (KR); Goeun Jung, Goyang-si (KR); HyungGeun Kwon, Gunpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 84 days.

(21) Appl. No.: 15/336,314

(22) Filed: Oct. 27, 2016

(65) Prior Publication Data

US 2017/0154930 A1  Jun. 1, 2017

(30) Foreign Application Priority Data

Nov. 30, 2015 (KR) .......................... 10-2015-0168669

(51) Int. Cl.
*G09G 3/3266* (2016.01)
*H01L 27/32* (2006.01)
(Continued)

(52) U.S. Cl.
CPC .......... *H01L 27/322* (2013.01); *G02B 5/0294* (2013.01); *G02B 5/201* (2013.01); *G02B 27/022* (2013.01); *H01L 27/3246* (2013.01); *G09G 3/3266* (2013.01); *G09G 2310/08* (2013.01); *G09G 2320/02* (2013.01); *H01L 51/5268* (2013.01); *H01L 51/5284* (2013.01)

(58) Field of Classification Search
CPC ..... G02F 27/022; G02B 5/0294; G02B 5/201; G09G 2310/08; G09G 2320/02; G09G 3/3266; H01L 27/322; H01L 27/3246; H01L 51/5268; H01L 51/5284
See application file for complete search history.

(56) References Cited

U.S. PATENT DOCUMENTS

2003/0122140 A1   7/2003  Yamazaki et al.
2003/0173897 A1*  9/2003  Iwase .................... H01L 27/322
                                                              313/512
(Continued)

FOREIGN PATENT DOCUMENTS

DE   103 92 604 T5     5/2005
JP   2012-248517 A    12/2012
(Continued)

*Primary Examiner* — Ram A Mistry
(74) *Attorney, Agent, or Firm* — Birch, Stewart, Kolasch & Birch, LLP

(57) ABSTRACT

An organic light emitting display device that can prevent non-emission areas from being visible as lattice patterns and a head-mounted display including the organic light emitting display device are provided. The organic light emitting display device includes anode electrodes, banks that define the anode electrodes, organic light-emitting layers that are disposed on the anode electrodes, and color filters that are disposed on the organic light-emitting layers. The banks include a color changing film that changes light emitted from the organic light-emitting layer into a predetermined color and outputs the changed color light.

13 Claims, 11 Drawing Sheets

(51) Int. Cl.
    *G02B 5/02*     (2006.01)
    *G02B 5/20*     (2006.01)
    *G02B 27/02*     (2006.01)
    *H01L 51/52*     (2006.01)

(56) References Cited

U.S. PATENT DOCUMENTS

| | | |
|---|---|---|
| 2004/0072380 A1 | 4/2004 | Yamazaki et al. |
| 2005/0248929 A1 | 11/2005 | Kawamura et al. |
| 2007/0205423 A1 | 9/2007 | Yamazaki et al. |
| 2012/0108142 A1 | 5/2012 | Lau |
| 2012/0261684 A1 | 10/2012 | Koshihara |
| 2013/0299808 A1 | 11/2013 | Sugimoto et al. |
| 2014/0084784 A1 | 3/2014 | Lee et al. |
| 2014/0197396 A1 | 7/2014 | Madigan |
| 2015/0001558 A1 | 1/2015 | Nozawa et al. |
| 2017/0261752 A1* | 9/2017 | Koshihara .......... G02B 27/0172 |

FOREIGN PATENT DOCUMENTS

| | | |
|---|---|---|
| JP | 2014-132525 A | 7/2014 |
| JP | 2015-144107 A | 8/2015 |
| KR | 10-2012-0118419 A | 10/2012 |
| KR | 10-2014-0039606 A | 4/2014 |
| KR | 10-2015-0082787 A | 7/2015 |
| KR | 10-2016-0015815 A | 2/2016 |
| TW | 201514585 A | 4/2015 |
| WO | WO 2010/092694 A1 | 8/2010 |

\* cited by examiner

ORGANIC LIGHT EMITTING DISPLAY DEVICE WITH BANK STRUCTURE FOR ENHANCED IMAGE QUALITY AND HEAD MOUNTED DISPLAY INCLUDING THE SAME

CROSS REFERENCE TO RELATED APPLICATIONS

This application claims priority and the benefit under 35 U.S.C. § 119(a) of Korean Patent Application No. 10-2015-0168669, filed on Nov. 30, 2015, which is hereby incorporated by reference for all purposes as if fully set forth herein.

BACKGROUND OF THE INVENTION

Field of the Invention

The present invention relates to an organic light emitting display device and a head-mounted display including the organic light emitting display device.

Description of the Related Art

With advancement of the information society, requirements for display devices for displaying an image are increasing in various forms. Accordingly, various display devices such as liquid crystal display (LCD), plasma display panel (PDP), and organic light emitting display (OLED) have been utilized.

The OLED device among the display devices is a self-emitting type device, is excellent in viewing angle and contrast, does not require a separate backlight such that it can be made lighter and thinner, and has a low power consumption compared to the liquid crystal display device. Also, the OLED device can be driven with a low DC voltage, has a high response speed, and in particular, there is a low manufacturing cost advantage.

The OLED device includes anode electrodes, banks defining the anode electrodes, a hole transporting layer, an organic light emitting layer, and an electron transporting layer which are formed on the anode electrodes, and a cathode electrode which is formed on the electron transporting layer. In this case, when a high-potential voltage is applied to the anode electrode and a low-potential voltage is applied to the cathode electrode, holes and electrons move to an organic light-emitting layer via the hole transporting layer and the electron transporting layer and are combined in the organic light-emitting layer to emit light. The OLED device may further include a black matrix containing a material capable of absorbing light at positions corresponding to the bank so as to prevent mixture of colors.

On the other hand, a head-mounted display including the OLED device has been developed. The head-mounted display is a glass-type monitoring device of virtual reality (VR) which is worn in the form of glasses or a helmet and in which a focus is formed at a position in front of a user's eyes. However, in the head-mounted display, since an image of the OLED device appears in front of the user's eyes, there is a problem that the non-emission areas are visible as lattice patterns as illustrated in FIG. 1.

SUMMARY OF THE INVENTION

Accordingly, one aspect of the present invention is to provide a display device and a head mounted display that substantially obviates one or more problems due to limitations and disadvantages of the related art.

Embodiments of the present invention provide an organic light emitting display device that can prevent non-emission areas from being visible as lattice patterns and a head-mounted display including the organic light emitting display device.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

According to an aspect of the present invention, there is provided an organic light emitting display device including: anode electrodes; banks that define the anode electrodes; organic light-emitting layers that are disposed on the anode electrodes; and color filters that are disposed on the organic light-emitting layers, wherein the banks include a color changing material that changes light emitted from the organic light-emitting layer into a predetermined color and outputs the changed color light.

Preferably, the color changing material is realized as a film. The film might be attached or cover a bank made of light absorbing material.

According to another aspect, the present invention provides an organic light emitting display device comprising: two adjacent pixels, each pixel includes an anode electrode; organic light-emitting layer that is disposed on the anode electrode; and color filters that are disposed on the organic light-emitting layers, wherein a bank is provided between two adjacent pixels, separating the anode electrodes; and wherein the bank include at least one color changing material that changes light emitted from the organic light-emitting layer into a predetermined color corresponding to the color filter of the pixel and outputs the changed color light.

Preferably, the pixels include organic light-emitting layers emitting white light, which is filtered by the color filter disposed above the organic light-emitting layers respectively having a certain color which is blocking other wavelengths than the respective color of the color filter and allows a passing of light having a wavelength of the color filter.

Preferably each bank includes a first color changing material that emits light of a first color which is transmitted by the first color filter; and a second color changing material that emits light of a second color which is transmitted by the second color filter neighboring the first color filter.

Preferably, the first color changing material is superimposed at least on parts of the bank surrounding the organic light-emitting layer associated to first color filter, and the second color changing material is superimposed at least on parts of the bank surrounding the organic light-emitting layer associated to the second color filter.

Preferably, each bank further includes a third color changing material that emits light of a third color which is obtained by mixing the first color transmitted by the first color filter and the second color transmitted by the second color filter neighboring the first color filter, wherein the third color changing material is disposed between the first color changing material and the second color changing material.

Preferably, the third color changing material is superimposed on the bank at a position aligned to a boundary between the first and second color filters.

Preferably, each bank further includes a light-blocking layer that blocks light emitted from the organic light-emitting layer. The light blocking layer may be disposed between the first color changing material and the second color changing material.

Preferably, the light-blocking layer is superimposed on the bank at a position aligned to on a boundary between the first and second color filters.

Preferably, each bank further includes a scattering layer that scatters light emitted from the organic light-emitting layer.

According to another aspect, the present invention provides an organic light emitting display device comprising two adjacent pixels, each pixel includes an anode electrode; an organic light-emitting layer that is disposed on the anode electrodes, and a bank provided between two adjacent pixels, wherein the bank covers edges of the anode electrodes of the adjacent pixels; and wherein each bank includes a separating body separating the anode electrodes; a scattering layer that covers the surface of the separating body and scatters light emitted from the organic light-emitting layer.

Preferably, the organic light-emitting layer is emitting one of R, G or B light or the organic light-emitting layer is emitting one of R, G, B or W light. Since light is emitted by the organic light-emitting layer in a specific wavelength portion no color filter is necessarily needed in this embodiment.

Preferably, the separating body includes an organic film that defines the anode electrodes and a reflective layer that covers the surface of the organic film and reflects light emitted from the organic light-emitting layer; or the separating body includes a light blocking layer. Thus, here no change of the color is required to avoid or prevent the non emission areas from being seen. Here only a scattering of the colored light is required.

Preferably, a polarizing film attached onto an upper substrate. This applies either for the display having a color filter, but also for the display having no color filter.

Preferably, an encapsulation film is formed on a cathode electrode.

Preferably, the banks are arranged between the anode electrodes, wherein edges of the banks partly cover edges of the anode electrodes thereby defining the anode electrodes.

Preferably, a transparent adhesive layer is provided for bonding an upper substrate to a lower substrate supporting a transistor array, the anodes electrodes, the organic light emitting layers, cathode electrodes, an encapsulation film.

Yet, according to another aspect, the present invention provides a head-mounted display comprising: an organic light emitting display device that displays an image; a display accommodating case that accommodates the organic light emitting display device; and a left-eye lens and a right-eye lens that are disposed on one side of the display accommodating case and are supplied with the image of the organic light emitting display.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the disclosed subject matter and are incorporated in and constitute a part of this application, illustrate embodiments of the disclosed subject matter and together with the description serve to explain the principle of the disclosed subject matter. In the drawings.

DETAILED DESCRIPTION OF THE EMBODIMENTS

Figure 1:
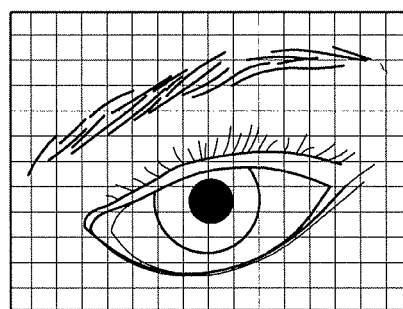
FIG. 1 is a diagram illustrating an example of a lattice pattern of an image which is displayed on a head-mounted display according to the related art.

Advantages and features of the invention and methods for achieving the advantages or features will be apparent from embodiments described below in detail with reference to the accompanying drawings. However, the invention is not limited to the embodiments but can be modified in various forms. The embodiments are provided merely for completing the disclosure of the invention and are provided for completely informing those skilled in the art of the scope of the invention. The scope of the invention is defined by only the appended claims.

Shapes, sizes, ratios, angles, number of pieces, and the like illustrated in the drawings, which are provided for the purpose of explaining the embodiments of the invention, are exemplary and thus the invention is not limited to the illustrated details. In the following description, like elements are referenced by like reference numerals. When it is determined that detailed description of the relevant known functions or configurations involved in the invention makes the gist of the invention obscure, the detailed description thereof will not be made.

When "include," "have", "be constituted", and the like are mentioned in the specification, another element may be added unless "only" is used. A singular expression of an element includes two or more elements unless differently mentioned.

In construing elements, an error range is included even when explicit description is not made.

For example, when positional relationships between two parts are described using 'on~', 'over~', 'under~', 'next~', and the like, one or more other parts may be disposed between the two parts unless 'just' or 'direct' is used.

For example, when temporal relationships are described using "after", "subsequent to", "next", "before", and the like, such expression may include temporal discontinuity unless "immediately" or "directly" is used.

Terms "first", "second", and the like can be used to describe various elements, but the elements should not be limited to the terms. The terms are used only to distinguish an element from another. Therefore, a first element may be a second element within the technical spirit of the invention.

An "X-axis direction," a "Y-axis direction," and a "Z-axis direction" should not be construed as a geometrical perpendicular relationship and may refer to wider directivity within a range in which the configuration of the present invention can functionally operate.

The term "at least one" should be understood to include all possible combinations of one or more relevant items. For example, "at least one of a first item, a second item, and a third item" individually means the first item, the second time, or the third item and also means all possible combinations of two or more of the first item, the second item, and the third item.

Features of the embodiments of the invention can be coupled or combined partially or on the whole and can be technically interlinked and driven in various forms. The embodiments may be put into practice independently or in combination.

Hereinafter, the embodiments of the invention will be described in detail with reference to the accompanying drawings.

[First Embodiment]

Figure 2:
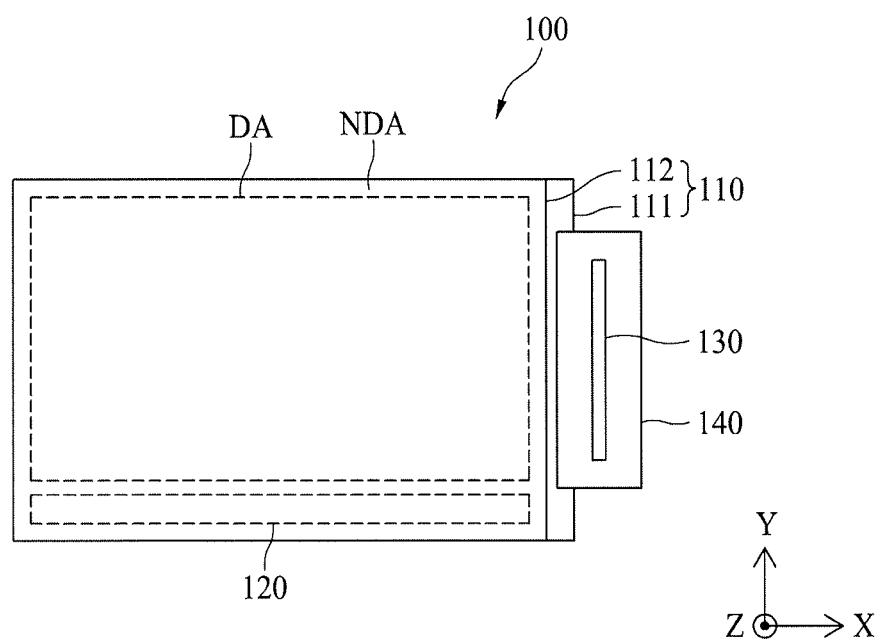
FIG. 2 is a diagram illustrating an example of an organic light emitting display device according to an embodiment of the present invention.

FIG. 2 is a diagram illustrating an example of an organic light emitting display device according to a first embodiment of the present invention. Referring to FIG. 2, an organic light emitting display device 100 according to the first embodiment of the present invention includes a display panel 110, a gate drive unit 120, a display driver 130, and a flexible film 140.

The display panel 110 includes a lower substrate 111 and an upper substrate 112. The upper substrate 112 may be an encapsulated substrate. The lower substrate 111 may be larger than the upper substrate 112. Accordingly, a part of the lower substrate 111 may not be covered with the upper substrate 112 but may be exposed therefrom.

Gate lines, data lines, and light-emitting areas are formed in a display area DA of the display panel 110. The gate lines and the data lines are formed to intersect each other. For example, the gate lines extend in the Y-axis direction and the data lines extend in the X-axis direction. The emission areas are formed in the intersection areas of the gate lines and the data lines. The emission areas of the display area DA display an image. Details of the display area DA will be described later with reference to FIGS. 3 and 4.

The gate drive unit 120 may be formed in a non-display area NDA outside one side of a display area DA of the display panel 110 in a gate-driver-in-panel (GIP) manner, or may be formed as a driver IC, mounted on a flexible film, and attached to the non-display area NDA outside one side of the display area DA of the display panel 110 in a tape-automated-bonding (TAB) manner.

The display driver 130 receives digital video data and a timing signal from an external system board. The display driver 130 generates a gate control signal for controlling the operation timing of the gate drive unit 120 and a source control signal for controlling supply of data voltages to the data lines on the basis of the timing signal. The display driver 130 supplies the gate control signal to the gate drive unit 120.

The display driver 130 converts the digital video data into analog data voltages in response to the source control signal and supplies the analog data voltages to the data lines. When the display driver 130 is formed as a driver IC, the display driver 130 may be mounted on the flexible film 140 in a chip-on-film (COF) manner or a chip-on-plastic (COP) manner.

Since the size of the lower substrate 111 is larger than the size of the upper substrate 112, a part of the lower substrate 111 may not be covered with the upper substrate 112 but exposed therefrom. Pads may be formed in the part of the lower substrate 111 which is not covered with the upper substrate 112 but exposed therefrom. The pads include data pads connected to the data lines and gate pads connected to the gate drive unit 120. Conductive lines for connecting the pads to the display driver 130 may be formed in the flexible film 140. The flexible film 140 may be bonded to the pads using an anisotropic conducting film and thus the pads may be connected to the conductive lines of the flexible film 140.

Figure 3:
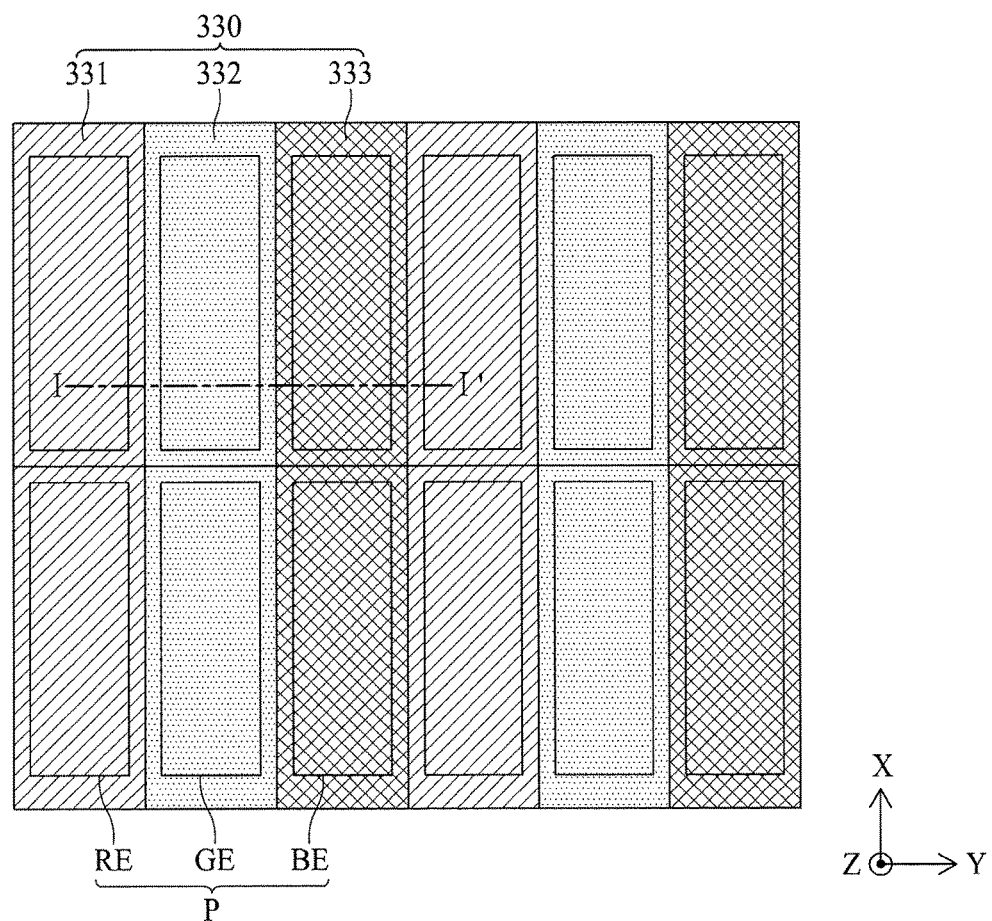
FIG. 3 is a plan view illustrating a part of a display area according to the first embodiment of the present invention.

FIG. 3 is a plan view illustrating a part of the display area illustrated in FIG. 2. In FIG. 3, only emission areas RE, GE, and BE and color changing films 330 are illustrated for the purpose of convenience of explanation.

Referring to FIG. 3, the emission areas RE, GE, and BE emit predetermined light from the organic light-emitting layers. The emission areas may include a red emission area RE emitting red light, a green emission area GE emitting green light, and a blue emission area BE emitting blue light. In this case, the red emission area RE, the green emission area GE, and the blue emission area BE serve as a single pixel.

On the other hand, the emission areas may further include a white emission area emitting white light in addition to the red emission area RE, the green emission area GE, and the blue emission area BE. In this case, the red emission area RE, the green emission area GE, the blue emission area BE, and the white emission area may serve as a single pixel. The emission areas RE, GE, and BE are defined by banks. That is, the banks are disposed between the emission areas RE, GE, and BE. The color changing films 330 may include a red changing film 331, a green changing film 332, and a blue changing film 333 as further described below with reference to FIG. 4.

Figure 4:
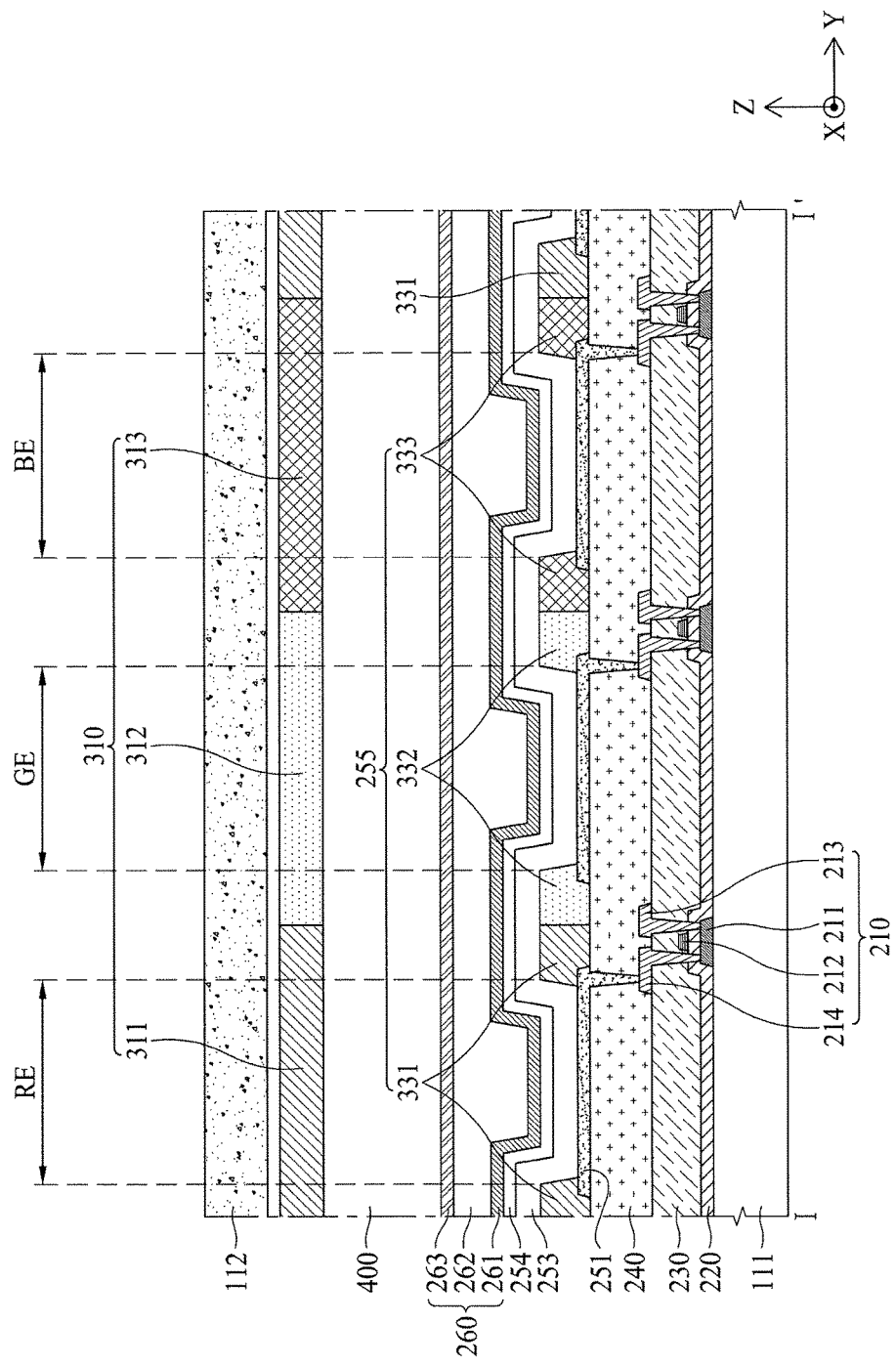
FIGS. 4 to 9 are cross-sectional views taken along line I-I' in FIG. 3 according to embodiments of the present invention.

FIG. 4 is a cross-sectional view taken along line I-I' in FIG. 3 according to the first embodiment of the present invention.

Referring to FIG. 4, thin film transistors 210 are formed on the lower substrate 111. Each of the thin film transistors 210 includes a semiconductor layer 211, a gate electrode 212, a source electrode 213, and the drain electrode 214. In FIG. 4, the thin film transistors 210 are formed in a top gate type in which the gate electrode 212 is located on the semiconductor layer 211, but the present invention is not limited thereto. That is, the thin film transistors 210 may be formed in a bottom gate type in which the gate electrode 212 is located under the semiconductor layer 211 or a double gate type in which the gate electrode 212 is located on and under the semiconductor layer 211.

The semiconductor layers 211 are formed on the lower substrate 111. A buffer film that protects the semiconductor layers 211 and enhances an interface adhesive force of the semiconductor layers 211 may be formed between the lower substrate 111 and the semiconductor layer 211. The buffer film may include plural inorganic films. An insulating interlayer 220 may be formed on the semiconductor layers 211. The gate electrodes 212 may be formed on the insulating interlayer 220. A gate insulating film 230 may be formed on the gate electrodes 212. The source electrodes 213 and the drain electrodes 214 may be formed on the gate insulating film 230. The source electrodes 213 and the drain electrodes 214 may be connected to the semiconductor layer 211 via contact holes penetrating the insulating interlayer 220 and the gate insulating film 230.

A planarization film 240 may be formed on the source electrodes 213 and the drain electrodes 214. The planarization film 240 is a film for arranging the pixels defined by the banks 255 so as to be flat. The planarization film 240 may be formed of a resin such as photo acryl or polyimide.

Organic light-emitting elements are formed on the planarization film 240. Each of the organic light-emitting elements includes an anode electrode 251, an organic light-emitting layer 253, and a cathode electrode 254 and is defined by the banks 255.

The anode electrodes 251 are formed on the planarization film 240. Each of the anode electrodes 251 is connected to the drain electrode 214 via a contact hole penetrating the planarization film 240.

The banks 255 define the anode electrodes 251. The banks 255 are formed to cover edges of each of the anode electrodes 251. In the organic light emitting display device according to the first embodiment of the present invention, color changing films 330 that absorb light emitted from the organic light-emitting layers 253, perform an excitation process of changing the frequency of the absorbed light, and emit the resultant light may be formed on the surfaces of the banks 255.

The color changing films 330 absorb light emitted from the organic light-emitting layers 253, change the colors thereof, and emit the resultant light. The color changing films 330 may include a color changing material (CCM) or a fluorescence exciting material. The color changing films 330 may absorb ultraviolet rays and emit visible rays.

The shorter the wavelength of light becomes, the larger the energy of light becomes and the longer the wavelength of light becomes, the smaller the energy of light becomes. The color changing material or the fluorescence exciting material absorbs ultraviolet rays with a wavelength shorter than that of visible rays, absorbs optical energy, excites the light to a wavelength of a visible ray band, and emits the excited visible rays.

The color changing films 330 may include a red changing film 331, a green changing film 332, and a blue changing film 333. The banks 255 may include plural color changing films. The red changing film 331 overlaps a red color filter 311, the green changing film 332 overlaps a green color filter 213, and the blue changing film 333 overlaps a blue color filter 313.

When the bank 255 is formed over the red emission area RE and the green emission area GE, the bank 255 may include the red changing film 331 and the green changing film 332. The red changing film 331 is disposed to overlap the red color filter 311 formed in the red emission area RE, and the green changing film 332 is disposed to overlap the green color filter 312 formed in the green emission area GE. Accordingly, since red light emitted from the red changing film 331 among the banks 255 can be transmitted by the red color filter 311 and green light emitted from the green changing film 332 can be transmitted by the green color filter 312, light can be efficiently used and the banks 255 which were originally non-emission areas can emit light.

Further, when the bank 255 is formed over the green emission area GE and the blue emission area BE, the bank 255 may include the green changing film 332 and the blue changing film 333. The green changing film 332 is disposed to overlap the green color filter 312 formed in the green emission area GE, and the blue changing film 333 is disposed to overlap the blue color filter 313 formed in the blue emission area BE. Accordingly, since green light emitted from the green changing film 332 among the banks 255 can be transmitted by the green color filter 312 and blue light emitted from the blue changing film 333 can be transmitted by the blue color filter 313, light can be efficiently used and the banks 255 which were originally non-emission areas can emit light.

In addition, when the bank 255 is formed over the blue emission area BE and the red emission area RE, the bank 255 may include the blue changing film 333 and the red changing film 331. The blue changing film 333 is disposed to overlap the blue color filter 313 formed in the blue emission area BE, and the red changing film 331 is disposed to overlap the red color filter 311 formed in the red emission area RE. Accordingly, since blue light emitted from the blue changing film 333 among the banks 255 can be transmitted by the blue color filter 313 and red light emitted from the red changing film 331 can be transmitted by the red color filter 311, light can be efficiently used and the banks 255 which were originally non-emission areas can emit light.

That is, when the color changing films 330 are not formed on the banks 255, the banks 255 corresponding to the non-emission areas may be visually recognized. However, when the color changing films 330 are formed on the banks 255, the banks also emit light of the same colors as the neighboring emission areas RE, GE, and BE and thus the banks 255 may not be visually recognized.

The organic light-emitting layers 253 are formed on the anode electrodes 251 and the banks 255. Each of the organic light-emitting layers 253 may include a hole transporting layer, a light-emitting layer, and an electron transporting layer. In this case, when a voltage is applied to the anode electrode 251 and the cathode electrode 254, holes and electrons are transported to the light-emitting layer via the hole transporting layer and the electron transporting layer and are combined in the light-emitting layer to emit light.

Each of the organic light-emitting layers 253 may include a UV light-emitting layer that emits ultraviolet (UV) light or a white light-emitting layer that emits white light. In this case, the UV light-emitting layer or the white light-emitting layer may be formed on the entire surface of the display area DA. Alternatively, each of the organic light-emitting layers 253 may include a red light-emitting layer that emits red light, a green light-emitting layer that emits green light, and a blue light-emitting layer that emits blue light. In this case, the red light-emitting layer may be formed in only the red emission areas RE, the green light-emitting layer may be formed in only the green emission areas GE, and the blue light-emitting layer may be formed in only the blue emission areas BE.

The cathode electrode 254 is formed on the organic light-emitting layers 253 and the banks 255 to cover the organic light-emitting layers 253 and the banks 255.

The organic light emitting display device may be embodied in a top emission type. In the top emission type, since light of the organic light-emitting layers 253 travels toward the upper substrate 112, the thin film transistors 210 can be arranged widely below the banks 255 and the anode electrodes 251. That is, the top emission type has a merit that a design area for the thin film transistors 210 is broader than that in the bottom emission type. In the top emission type, it is preferable that the anode electrodes 251 be formed of a metal material having high reflectance such as aluminum or a stacked structure of aluminum and ITO in order to achieve an effect of micro cavity. In addition, in the top emission type, since light of the organic light-emitting layers 253 travels toward the upper substrate 112, the cathode electrode 254 may be formed of a transparent metal material transmitting light such as ITO or IZO or may be formed of a translucent metal material such as magnesium (Mg), silver (Ag), or an alloy of magnesium (Mg) and silver (Ag).

An encapsulation film 260 is formed on the cathode electrode 254. The encapsulation film 260 serves to prevent oxygen or moisture from permeating the organic light-emitting layers 253. Accordingly, the encapsulation film 260 may include a first inorganic film 261, an organic film 262, and a second inorganic film 263.

The first inorganic film 261 is formed on the cathode electrode 254 to cover the cathode electrode 254. The organic film 262 is formed on the first inorganic film 261 to prevent particles from invading the organic light-emitting layers 253 and the cathode electrode 254 through the first inorganic film 261. The second inorganic film 263 is formed on the organic film 262 to cover the organic film 262.

Each of the first and second inorganic films 261 and 263 may be formed of silicon nitride, aluminum nitride, zirconium nitride, titanium nitride, hafnium nitride, tantalum nitride, silicon oxide, aluminum oxide, or titanium oxide. For example, each of the first and second inorganic films 261 and 263 may be formed of $SiO_2$, $Al_2O_3$, SiON, or SiNx. The organic film 262 may be formed to be transparent so as to transmit light emitted from the organic light-emitting layers 253.

The lower substrate 111 and the upper substrate 112 are bonded to each other with a transparent adhesive layer 400. The transparent adhesive layer 400 may be formed of a transparent adhesive resin. Specifically, the transparent adhesive layer 400 bonds the second inorganic film 263 of the lower substrate 111 and the upper substrate 112.

As described above, in the organic light emitting display device according to the first embodiment of the present invention, the banks 255 include the color changing films 330. As a result, in the organic light emitting display device according to the first embodiment of the present invention, since light of the same colors as the neighboring emission areas RE, GE, and BE is emitted from the banks 255 formed at the edges of the emission areas RE, GE, and BE, the banks 255 may hardly be visually recognized. Accordingly, even when the organic light emitting display device according to the first embodiment of the present invention is applied to a head-mounted display, it is possible to prevent the banks 255 from being visually recognized as lattice patterns. Details of the head-mounted display will be described later with reference to FIGS. 10A, 10B, 11, and 12.

[Second Embodiment]

Figure 5:
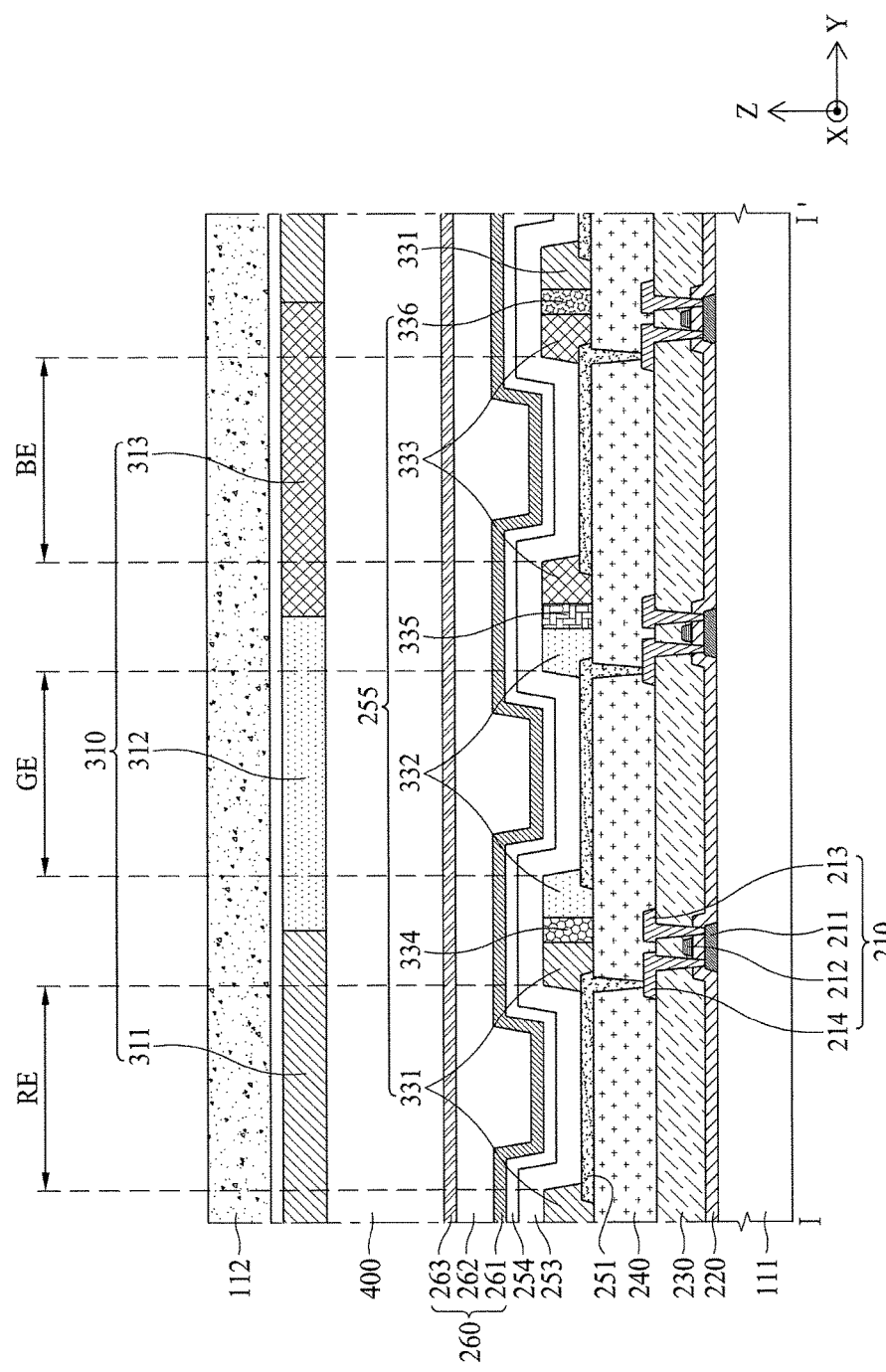

FIG. 5 is a cross-sectional view taken along line I-I' in FIG. 3 according to a second embodiment of the present invention. The structure illustrated in FIG. 5 is substantially the same as described with reference to FIG. 4, except for the banks 255. Hereinafter, details of the substantially same structure as illustrated in FIG. 4 will not be described for the purpose of convenience of explanation.

The banks 255 define the anode electrodes 251. The banks 255 are formed to cover the edges of the anode electrodes 251.

The banks 255 may further include a third color changing film, which can change a color into a color into which two colors of red, green, and blue are mixed as illustrated in FIG. 5, between the first color changing film and the second color changing film in order to slow down a color change between the neighboring emission areas. The third color changing film may be superimposed on a boundary between the first color filter and the second color filter.

The bank disposed between the red emission area RE and the green emission area GE may further include a yellow changing film 334 of which the color is a mixed color of red and green between the red changing film 331 and the green changing film 332. The bank disposed between the green emission area GE and the blue emission area BE may further include a bluish green changing film 335 of which the color is a mixed color of green and blue between the green changing film 332 and the blue changing film 333. The bank disposed between the blue emission area BE and the red emission area RE may further include a violet changing film 336 of which the color is a mixed color of blue and red between the blue changing film 333 and the red changing film 331.

As described above, in the organic light emitting display device according to the second embodiment of the present invention, the third color changing film which can change a color into a color into which two colors of red, green, blue are mixed may be further disposed between the first color changing film and the second color changing film. As a result, in the organic light emitting display device according to the second embodiment of the present invention, it is possible to slowdown a color change between the neighboring emission areas. Accordingly, even when the organic light emitting display device according to the second embodiment of the present invention is applied to a head-mounted display, it is possible to slow down a color change between the neighboring emission areas. Details of the head-mounted display will be described later with reference to FIGS. 10A, 10B, 11, and 12.

[Third Embodiment]

Figure 6:
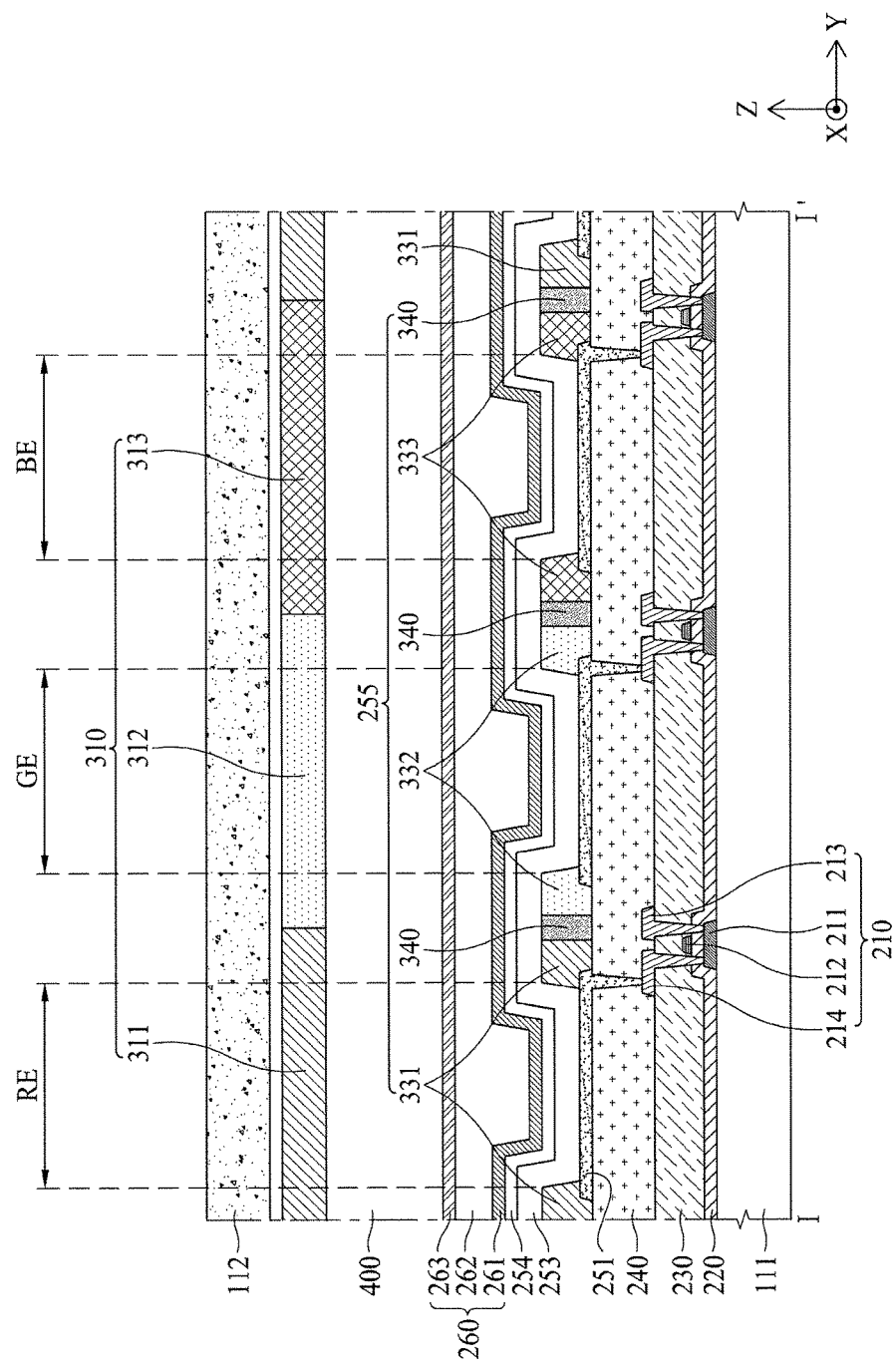

FIG. 6 is a cross-sectional view taken along line I-I' in FIG. 3 according to a third embodiment of the present invention. The structure illustrated in FIG. 6 is substantially the same as described with reference to FIG. 4, except for the banks 255. Hereinafter, details of the substantially same structure as illustrated in FIG. 4 will not be described for the purpose of convenience of explanation.

The banks 255 define the anode electrodes 251. The banks 255 are formed to cover the edges of the anode electrodes 251.

The banks 255 may further include a light blocking layer 340 that absorbs light between the red changing film 331 and the green changing film 332, between the green changing film 332 and the blue changing film 333, and between the blue changing film 333 and the red changing film 331 in order to prevent color mixture between the neighboring emission areas as illustrated in FIG. 6. The light blocking layer 340 may be superimposed on a boundary part between the first color filter and the second color filter.

As described above, in the organic light emitting display device according to the third embodiment of the present invention, the light blocking layer 340 that absorbs light may be further disposed between the first color changing film and the second color changing film. As a result, in the organic light emitting display device according to the third embodiment of the present invention, it is possible to prevent color mixture between the neighboring emission areas. Accordingly, even when the organic light emitting display device according to the third embodiment of the present invention is applied to a head-mounted display, it is possible to prevent color mixture between the neighboring emission areas. Details of the head-mounted display will be described later with reference to FIGS. 10A, 10B, 11, and 12.

[Fourth Embodiment]

Figure 7:
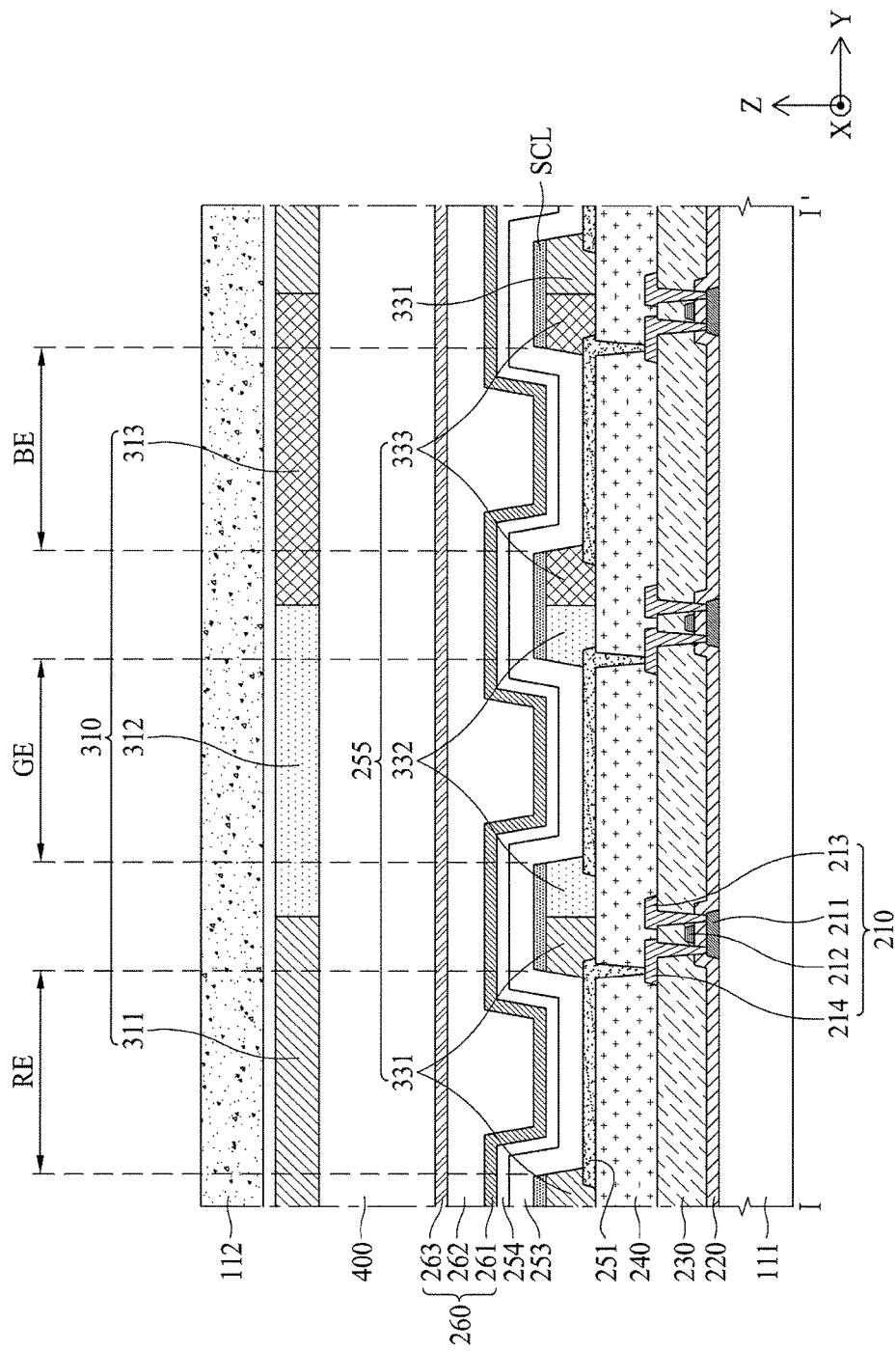

FIG. 7 is a cross-sectional view taken along line I-I' in FIG. 3 according to a fourth embodiment of the present invention. The structure illustrated in FIG. 7 is substantially the same as described with reference to FIG. 4, except for a scattering layer SCL. Hereinafter, details of the substantially same structure as illustrated in FIG. 4 will not be described for the purpose of convenience of explanation.

The scattering layer SCL is formed on the banks 255. The scattering layer SCL includes a scattering material that can scatter light. The scattering material may be high-refractive metal oxide such as $TiO_2$ or $ZrO_2$. It is preferable that the scattering material have a size of 100 nm to 300 nm and the content of the scattering material in the scattering layer SCL range from 5% to 30%. When the size of the scattering material is smaller than 100 nm or the content of the scattering material is less than 5%, a light scattering effect may be lowered. When the size of the scattering material is larger than 300 nm or the content of the scattering material is greater than 30%, light transmittance may be lowered.

The scattering layer SCL is formed to be superimposed on the banks 255. Accordingly, the scattering layer SCL can scatter light emitted from the color changing film 330 formed on the bank 255. Since the light emitted from the color changing film 330 is scattered, it is possible to prevent the bank 255 from being visually recognized by the scattered light.

On the other hand, the larger the overlap area of the scattering layer SCL and the emission areas RE, GE, and BE becomes, the larger light scattered by the scattering layer SCL becomes and thus the scattering effect of the scattering layer SCL may increase. However, when the scattering effect of the scattering layer SCL is excessively large, there is a problem in that a haze appears in which an image is foggy. Accordingly, the overlap areas of the scattering layer SCL and the emission areas RE, GE, and BE can be determined by experiment or the like in advance.

As described above, in the organic light emitting display device according to the fourth embodiment of the present invention, scattering layers SCL are formed at least partly on the banks 255 or fully covering the banks 255. As a result, since light emitted from the color changing films 330 is scattered, the banks may hardly be visually recognized by the scattered light. Accordingly, even when the organic light emitting display device according to the fourth embodiment of the present invention is applied to a head-mounted display, it is possible to prevent the banks 255 from being visually recognized in the lattice pattern. Details of the head-mounted display will be described later with reference to FIGS. 10A, 10B, 11, and 12.

[Fifth Embodiment]

Figure 8:
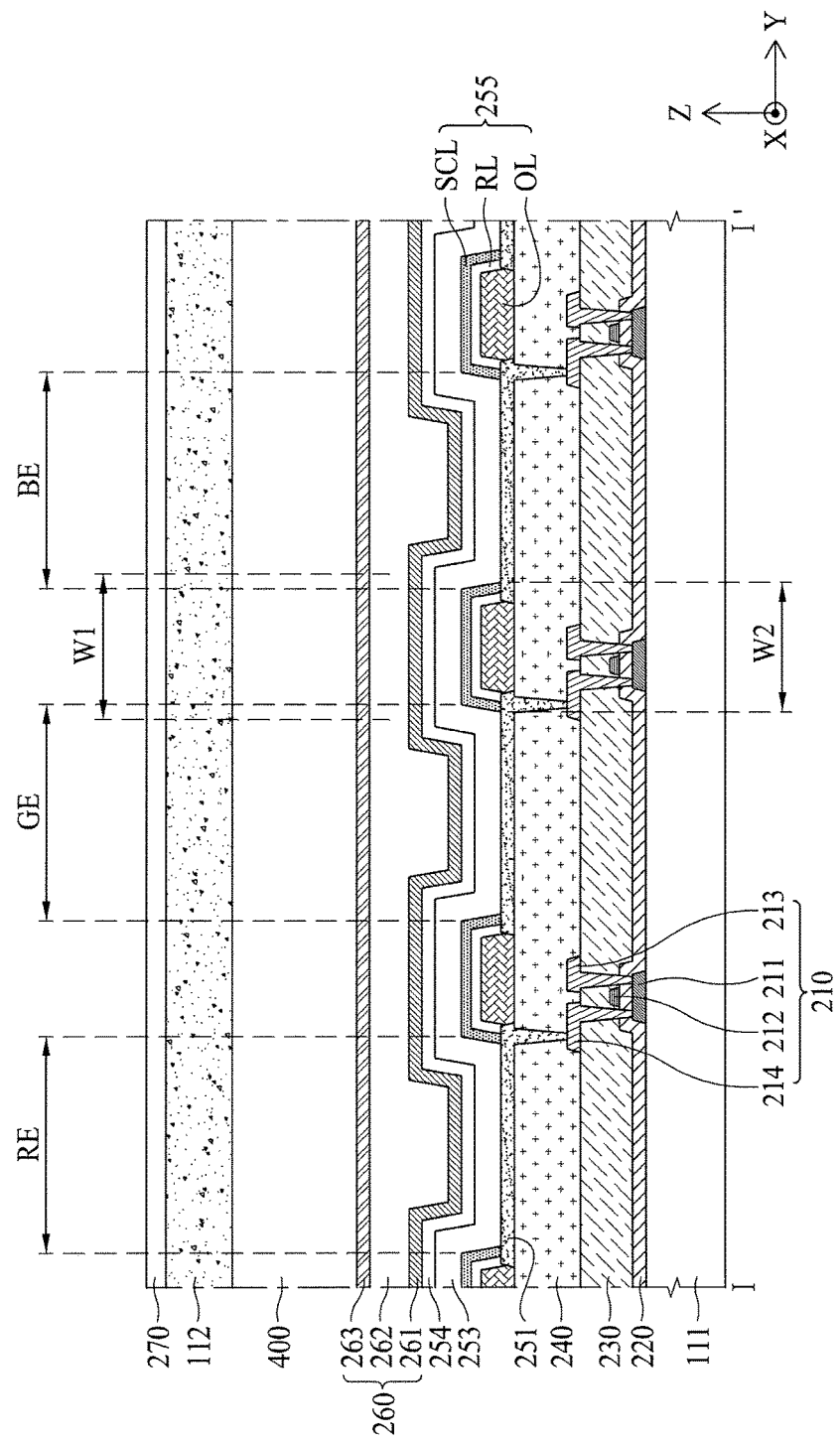
Figure 9:
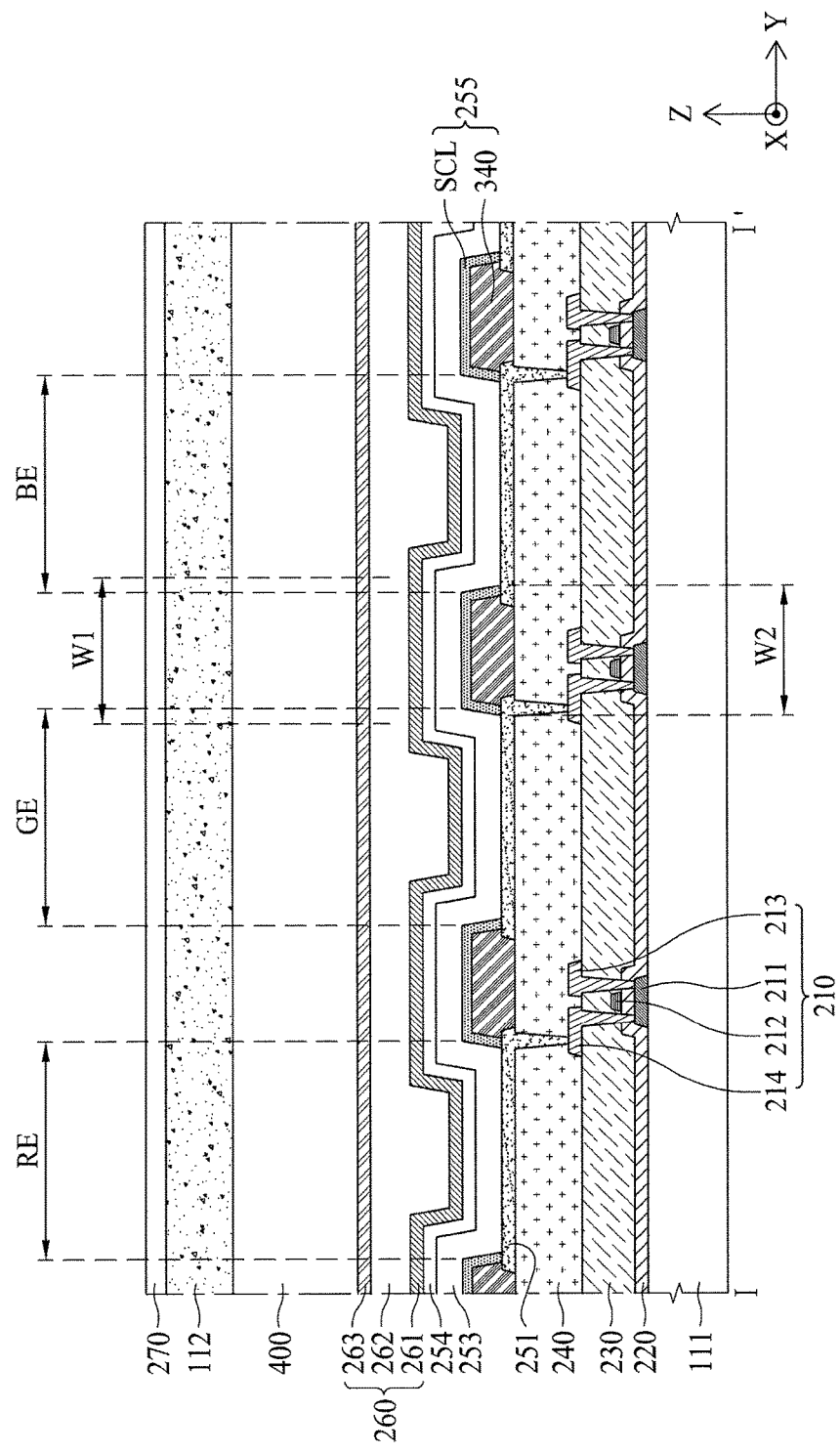

FIGS. 8 and 9 are cross-sectional views taken along line I-I' in FIG. 3 according to a fifth embodiment of the present invention. The structure illustrated in FIGS. 8 and 9 is substantially the same as described with reference to FIG. 4, except for banks 255 and a polarizing film 270. Hereinafter, details of the substantially same structure as illustrated in FIG. 4 will not be described for the purpose of convenience of explanation.

As illustrated in FIG. 8, each bank 255 may include an organic film OL, a reflective layer RL, and a scattering layer SCL.

The organic films OL define the anode electrodes 251. The organic films OL hold the positions and the shapes of the banks 255. The organic films OL may fix the reflective layers RL so as not to move. The organic layer OL is not overlapping with the anode electrodes 251. Light emitted from the organic light-emitting layers 253 is not incident into the organic films OL. Accordingly, the organic films OL can be formed using all types of materials which can easily form the banks 255 regardless of the optical characteristics.

The reflective layer RL covers the surface of each organic film OL. The reflective layers RL reflect light emitted from the organic light-emitting layers 253. The reflective layer RL may have a taper shape having an inclined surface to prevent color mixture between the neighboring organic light-emitting layers 253. The reflective layer RL may be formed using all types of materials having high reflectance.

The scattering layer SCL covers the surface of each reflective layer RL. The scattering layer SCL is substantially the same as the scattering layer SCL according to the third embodiment of the present invention and thus details thereof will not be described.

Alternatively, as illustrated in FIG. 9, each bank 255 may include a light blocking layer 340 and a scattering layer SCL.

The light blocking layer 340 forms an internal layer of the bank 255. The light blocking layer 340 holds the position and the shape of each bank 255 and absorbs light emitted from the organic light-emitting layer 253. The light blocking layer 340 can be formed as a black bank or a gray bank. The light blocking layer 340 can be formed of a material capable of absorbing light or a material having reflectance of 20% or less.

The scattering layer SCL covers the surface of each light blocking layer 340. The scattering layer SCL is substantially the same as the scattering layer SCL according to the fourth embodiment of the present invention and thus details thereof will not be described.

A polarizing film 270 may be attached onto the upper substrate 112. The polarizing film 270 serves to prevent external light from being reflected to a user by the cathode electrode 254 and the anode electrodes 251 of the lower substrate 112. That is, according to the fifth embodiment of the present invention, by attaching the polarizing film 270 onto the upper substrate 112, it is possible to prevent visibility of an image displayed in the emission areas RE, GE, and BE from being lowered due to external light.

As described above, in the organic light emitting display device according to the fifth embodiment of the present invention, each bank 255 includes the organic film OL, the reflective layer RL, and the scattering layer SCL or alternatively a light blocking layer 340 and a scattering layer SCL.

As a result, in the organic light emitting display device according to the fifth embodiment of the present invention, since light emitted from the organic light-emitting layers 253 is reflected by the reflective layer RL and then scattered by the scattering layer SCL or just scattered by the scattering layer SCL, it is possible to prevent the banks 255 corresponding to the non-emission areas from being visually recognized by the scattered light. Accordingly, even when the organic light emitting display device according to the fifth embodiment of the present invention is applied to a head-mounted display, it is possible to prevent the non-emission areas from being visually recognized in the lattice pattern.

Figure 10A:
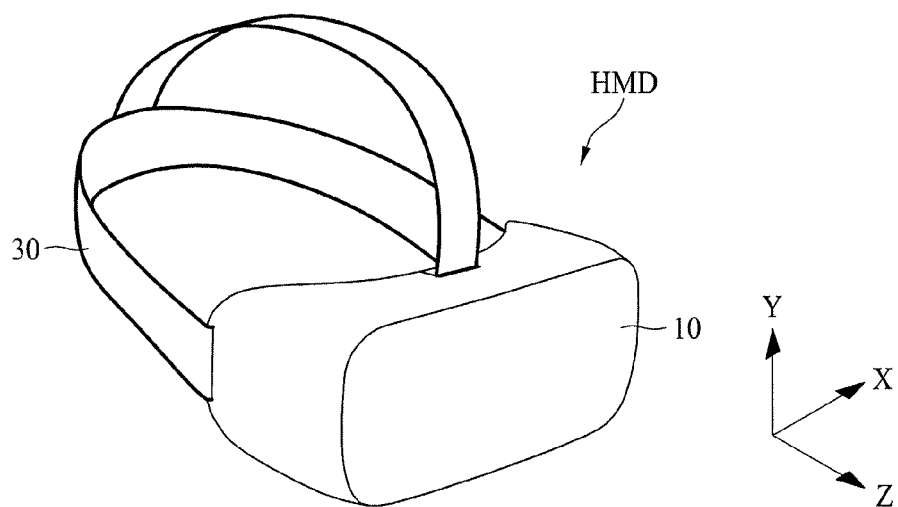
FIGS. 10A and 10B are diagrams illustrating an example of the head-mounted display according to the embodiment of the present invention.
Figure 10B:
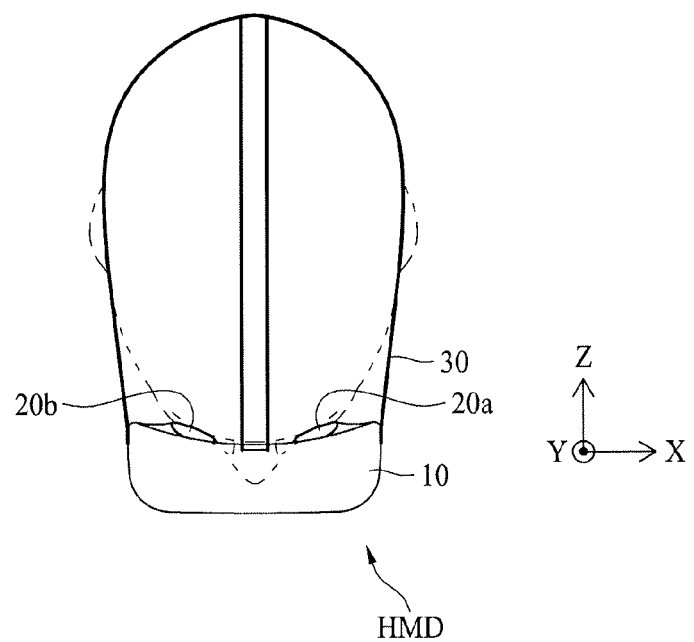
Figure 11:
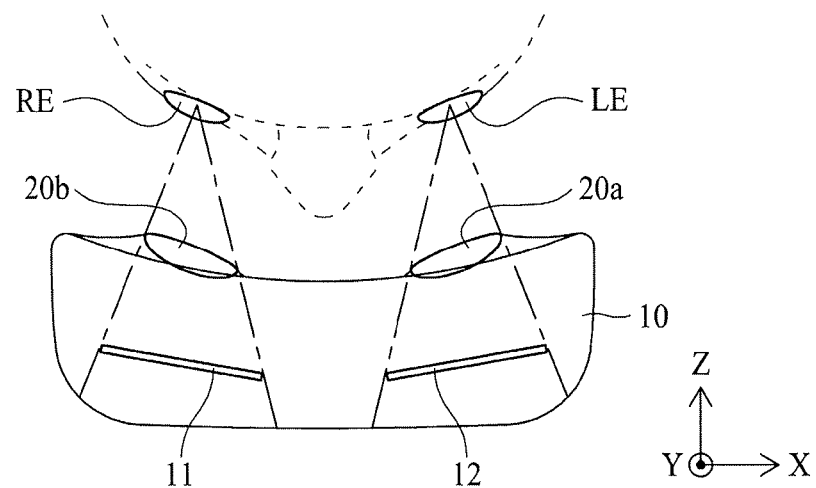
FIGS. 11 and 12 are diagrams illustrating an example of a display accommodating case illustrated in FIG. 11.

FIGS. 10A and 10B are diagrams illustrating a head-mounted display according to an embodiment of the present invention.

Referring to FIGS. 10A and 10B, the head-mounted display HMD according to the embodiment of the present invention includes a display accommodating case 10, a left-eye lens 20a, a right-eye lens 20b, and a head-mounting band 30.

The display accommodating case 10 accommodates a display device and provides an image of the display device to the left-eye lens 20a and the right-eye lens 20b. The display device may be the organic light emitting display devices according to the embodiments of the present invention. The organic light emitting display devices according to the embodiments of the present invention are the same as described above with reference to FIGS. 2 to 9.

The display accommodating case 10 may be designed to provide the same image to the left-eye lens 20a and the right-eye lens 20b. Alternatively, the display accommodating case 10 may be designed to display a left-eye image on the left-eye lens 20a and to display a right-eye image on the right-eye lens 20b.

Figure 12:
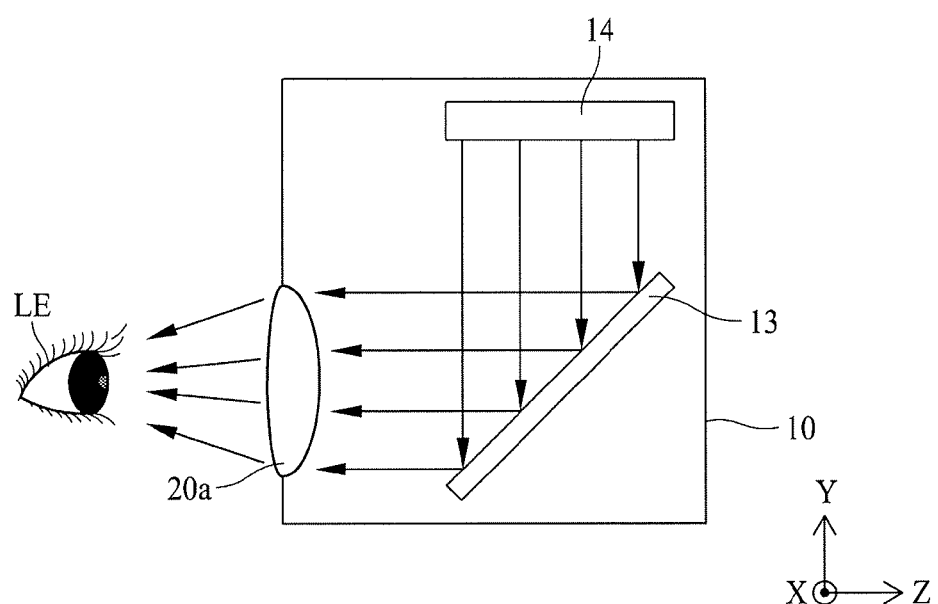

A left-eye organic light emitting display device 11 disposed in front of the left-eye lens 20a and a right-eye organic light emitting display device 12 disposed in front of the right-eye lens 20b may be accommodated in the display accommodating case 10. FIG. 12 illustrates a cross-sectional view when the display accommodating case 10 is viewed from the upper side. The left-eye organic light emitting display device 11 can display a left-eye image and the right-eye organic light emitting display device 12 can display a right-eye image. Accordingly, the left-eye image displayed by the left-eye organic light emitting display device 11 is provided to a user's left eye LE via the left-eye lens 20a, and the right-eye image displayed by the right-eye organic light emitting display device 12 is provided to the user's right eye via the right-eye lens 20b.

Figure 13:
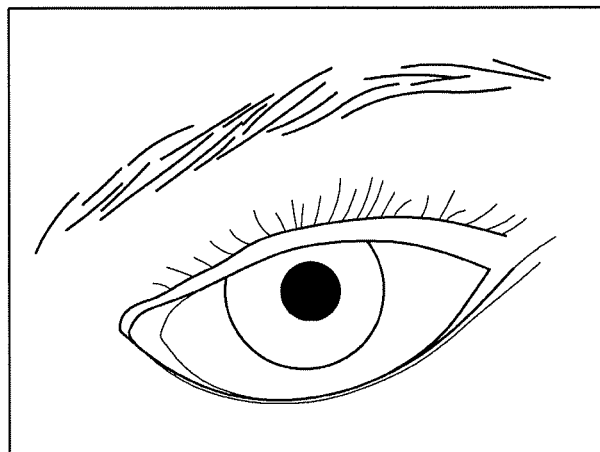
FIG. 13 is a diagram illustrating an example of a lattice pattern of an image which is displayed on a head-mounted display according to an embodiment of the present invention.

The display accommodating case 10 may accommodate mirror reflective plates 13 disposed in front of the left-eye lens 20a and the right-eye lens 20b and organic light emitting display devices 14 disposed on the mirror reflective plates 13. FIG. 13 illustrates a cross-sectional view when the display accommodating case 10 is viewed from a side. The organic light emitting display device 14 displays an image toward the mirror reflective plate 13, and the mirror reflective plate 13 totally reflects the image of the organic light emitting display device 14 to the left-eye lens 20a and the right-eye lens 20b. Accordingly, the image displayed on the organic light emitting display device 14 can be provided to the left-eye lens 20a and the right-eye lens 20b. FIG. 13 illustrates only the left-eye lens 20a and the user's left eye LE for the purpose of convenience of explanation.

The left-eye lens 20a and the right-eye lens 20b are disposed on one side surface of the display accommodating case 10. The left-eye lens 20a and the right-eye lens 20b are formed to watch the display accommodating case 10. The user's left eye is located in the left-eye lens 20a and the user's right eye is located in the right-eye lens 20b.

The left-eye lens 20a and the right-eye lens 20b may be convex lenses. In this case, the image displayed on the display accommodating case 10 may be provided to the user in an enlarged state due to the left-eye lens 20a and the right-eye lens 20b. Alternatively, the left-eye lens 20a and the right-eye lens 20b may not have a function of enlarging or reducing an image displayed on the display accommodating case 10.

The head-mounting band 30 is fixed to the display accommodating case 10. The head-mounting band 30 is formed to surround the top surface and both side surfaces of a user, but the present invention is not limited thereto. The head-mounting band 30 serves to fix the head-mounted display to the user's head and may be formed in the form of an eyeglass frame or a helmet.

On the other hand, in the head-mounted display according to the related art, since an image of the organic light emitting display device appears in right front of a user's eyes, there is a problem in that the non-emission areas are visually recognized in a lattice pattern as illustrated in FIG. 1. However, in the head-mounted display according to the embodiment of the present invention, the banks 255 include the color changing films 330. As a result, the organic light emitting display device according to the embodiment of the present invention, since light of the same colors as the emission areas RE, GE, and BE is emitted from the bank 255 formed at the edges of the emission areas RE, GE, and BE, the banks 255 may hardly be visually recognized. Accordingly, the head-mounted display according to the embodiment of the present invention can prevent the non-emission areas of the organic light emitting display device from being visually recognized in the lattice patterns.

In the head-mounted display according to another embodiments of the present invention, each bank 255 includes the organic film OL, the reflective layer RL, and the scattering layer SCL. As a result, since light emitted from the organic light-emitting layers 253 is reflected by the reflective layer RL and then scattered by the scattering layer SCL, the banks 255 corresponding to the non-emission areas may hardly be visually recognized by the scattered light. Accordingly, the head-mounted display according to the embodiment of the present invention can prevent the non-emission areas of the organic light emitting display device from being visually recognized in the lattice patterns.

While embodiments of the present invention have been described in detail with reference to the accompanying drawings, the invention is not limited to the embodiments, but can be modified in various forms without departing from the technical spirit of the invention. Accordingly, the embodiments of the invention are not provided to limit the technical spirit of the invention but to explain the technical sprit of the invention, and the technical spirit of the invention is not limited to the embodiments. Therefore, it should be understood that the above-mentioned embodiments are exemplary but are not restrictive in all terms. The scope of the invention should be analyzed on the basis of the appended claims and it should be analyzed that all the technical concepts equivalent thereto are included in the scope of the invention.

What is claimed is:

1. An organic light emitting display device comprising:
   two adjacent pixels including two adjacent anode electrodes, respectively;
   an organic light-emitting layer disposed on the two adjacent anode electrodes; and
   red, green, and blue color filters disposed on the organic light-emitting layer,
   wherein a bank is disposed between the two adjacent anode electrodes of the two adjacent pixels, and separates the two adjacent anode electrodes from each other,
   wherein the bank includes at least one color changing material that changes light emitted from the organic light-emitting layer into a predetermined color corresponding to one of the red, green, and blue color filters disposed on the organic light-emitting layer and outputs the changed color light,
   wherein the organic light-emitting layer is disposed between the bank and the red, green, and blue color filters.

2. The organic light emitting display device according to claim 1, wherein the organic light-emitting layer emits white light.

3. The organic light emitting display device according to claim 1, wherein the bank includes:
   a first color changing material that emits light of a first color which is transmitted by a first color filter; and
   a second color changing material that emits light of a second color which is transmitted by a second color filter neighboring the first color filter.

4. The organic light emitting display device according to claim 3, wherein the first color changing material is superimposed at least on parts of the bank surrounding the organic light-emitting layer associated to the first color filter, and the second color changing material is superimposed at least on parts of the bank surrounding the organic light-emitting layer associated to the second color filter.

5. The organic light emitting display device according to claim 3, wherein each bank further includes a third color changing material that emits light of a third color which is obtained by mixing the first color transmitted by the first color filter and the second color transmitted by the second color filter neighboring the first color filter, wherein the third color changing material is disposed between the first color changing material and the second color changing material.

6. The organic light emitting display device according to claim 5, wherein the third color changing material is superimposed on the bank at a position aligned to a boundary between the first and second color filters.

7. The organic light emitting display device according to claim 6, wherein each bank further includes a light-blocking layer that blocks light emitted from the organic light-emitting layer, and the light blocking layer is disposed between the first color changing material and the second color changing material.

8. The organic light emitting display device according to claim 7, wherein the light-blocking layer is superimposed on the bank at a position aligned to on a boundary between the first and second color filters.

9. The organic light emitting display device according to claim 8, wherein each bank further includes a scattering layer that scatters light emitted from the organic light-emitting layer.

10. The organic light emitting display device according to claim 1, wherein the bank contacts outer edges of the two adjacent anodes.

11. The organic light emitting display device according to claim 1, wherein the bank overlaps with the red, green, and blue color filters in a viewing direction of the organic light emitting display device.

12. A head-mounted display comprising:
an organic light emitting display device configured to display an image;
a display accommodating case configured to accommodate the organic light emitting display device; and
a left-eye lens and a right-eye lens that are disposed on one side of the display accommodating case and configured to receive the image of the organic light emitting display, wherein the organic light emitting display device includes:
two adjacent pixels including two adjacent anode electrodes, respectively;
an organic light-emitting layer disposed on the two adjacent anode electrodes; and
red, green, and blue color filters disposed on the organic light-emitting layer,
wherein a bank is disposed between the two adjacent anode electrodes of the two adjacent pixels, and separates the two adjacent anode electrodes from each other, wherein the bank includes at least one color changing material that changes light emitted from the organic light-emitting layer into a predetermined color corresponding to one of the red, green, and blue color filters disposed on the organic light-emitting layer and outputs the changed color light, wherein the organic light-emitting layer is disposed between the bank and the red, green, and blue color filters.

13. A method of forming an organic light emitting display device, the method comprising:
providing two adjacent pixels including two adjacent anode electrodes, respectively;
forming an organic light-emitting layer on the two adjacent anode electrodes;
forming a bank between the two adjacent anode electrodes of the two adjacent pixels to separate the two adjacent anode electrodes from each other; and
providing red, green, and blue color filters on the organic light-emitting layer, wherein the bank includes at least one color changing material that changes light emitted from the organic light-emitting layer into a predetermined color corresponding to one of the red, green, and blue color filters disposed on the organic light-emitting layer and outputs the changed color light, wherein the organic light-emitting layer is disposed between the bank and the red, green, and blue color filters.

* * * * *